(12) United States Patent
Hashiguchi et al.

(10) Patent No.: US 11,056,601 B2
(45) Date of Patent: Jul. 6, 2021

(54) SOLAR CELL

(71) Applicant: Panasonic Corporation, Osaka (JP)

(72) Inventors: Taiki Hashiguchi, Osaka (JP); Kenta Matsuyama, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 146 days.

(21) Appl. No.: 16/565,932

(22) Filed: Sep. 10, 2019

(65) Prior Publication Data

US 2020/0111928 A1 Apr. 9, 2020

(30) Foreign Application Priority Data

Oct. 9, 2018 (JP) .............................. JP2018-191156

(51) Int. Cl.
*H01L 31/0747* (2012.01)
*H01L 31/20* (2006.01)
*H01L 31/028* (2006.01)
*H01L 31/0376* (2006.01)

(52) U.S. Cl.
CPC ........ *H01L 31/0747* (2013.01); *H01L 31/028* (2013.01); *H01L 31/03762* (2013.01); *H01L 31/202* (2013.01)

(58) Field of Classification Search
None
See application file for complete search history.

(56) References Cited

U.S. PATENT DOCUMENTS

| | | | |
|---|---|---|---|
| 2008/0230121 A1* | 9/2008 | Terakawa | H01L 31/202 136/261 |
| 2014/0102528 A1* | 4/2014 | Yano | H01L 31/0747 136/255 |
| 2015/0059839 A1* | 3/2015 | Yano | H01L 31/028 136/255 |

FOREIGN PATENT DOCUMENTS

JP    2008-192764 A    8/2008

* cited by examiner

*Primary Examiner* — Devina Pillay
(74) *Attorney, Agent, or Firm* — McDermott Will & Emery LLP (57) ABSTRACT

A solar cell includes an n-type silicon substrate having a first main surface and a second main surface, an n-type first semiconductor layer disposed above the first main surface, a first intrinsic semiconductor layer disposed between the first main surface and the first semiconductor layer, a p-type second semiconductor layer disposed on the second main surface, and a second intrinsic semiconductor layer disposed between the second main surface and the second semiconductor layer. An oxygen concentration at an interface between the silicon substrate and the second intrinsic semiconductor layer is lower than an oxygen concentration at an interface between the silicon substrate and the second intrinsic semiconductor layer. An oxygen concentration at an interface between the second intrinsic semiconductor layer and the second semiconductor layer is higher than an oxygen concentration at an interface between the first intrinsic semiconductor layer and the first semiconductor layer.

6 Claims, 8 Drawing Sheets

SOLAR CELL

CROSS REFERENCE TO RELATED APPLICATIONS

This application claims the benefit of priority of Japanese Patent Application Number 2018-191156, filed on Oct. 9, 2018, the entire content of which is hereby incorporated by reference.

TECHNICAL FIELD

The present disclosure relates to a solar cell.

BACKGROUND ART

Hitherto, development of solar cells as photoelectric conversion devices that convert light energy to electrical energy has been advancing steadily. Since solar cells are capable of directly converting the inexhaustible supply of solar light to electricity, are cleaner and cause a smaller burden on the environment than power generation using fossil fuels, they have raised high expectations as a new energy source.

Japanese Unexamined Patent Application Publication No. 2008-192764 discloses a photoelectric conversion element (solar cell) in which a second intrinsic amorphous semiconductor layer is formed on a non-light-receiving surface of a semiconductor substrate after a first intrinsic amorphous semiconductor layer is formed on a light-receiving surface of the semiconductor substrate.

A solar cell that limits peeling of the semiconductor substrate and amorphous semiconductor layer along with improving power generation efficiency is desirable.

Accordingly, the present disclosure aims to provide a solar cell that is capable of limiting peeling of the semiconductor substrate and the amorphous semiconductor layer along with improving power generation efficiency.

SUMMARY

In order to achieve to above objective, a solar cell according to an aspect of the present invention includes: a semiconductor substrate that includes crystalline silicon of a first conductivity type, and has a first main surface and a second main surface facing away from the first main surface; a first semiconductor layer that includes an amorphous silicon thin film of the first conductivity type, and is disposed above the first main surface; a first intrinsic semiconductor layer that includes an intrinsic amorphous silicon thin film, and is disposed between the first main surface and the first semiconductor layer; a second semiconductor layer that includes an amorphous silicon thin film of a second conductivity type, and is disposed above the second main surface; and a second intrinsic semiconductor layer that includes an intrinsic amorphous silicon thin film, and is disposed between the second main surface and the second semiconductor layer. A first oxygen concentration at an interface between the semiconductor substrate and the second intrinsic semiconductor layer is lower than a second oxygen concentration at an interface between the semiconductor substrate and the first intrinsic semiconductor layer. A third oxygen concentration at an interface between the second intrinsic semiconductor layer and the second semiconductor layer is higher than a fourth oxygen concentration at an interface between the first intrinsic semiconductor layer and the first semiconductor layer.

One aspect of the present invention makes it possible to provide a solar cell that is capable of limiting peeling of the semiconductor substrate and the amorphous semiconductor layer along with improving power generation efficiency.

BRIEF DESCRIPTION OF THE DRAWINGS

The figures depict one or more implementations in accordance with the present teaching, by way of examples only, not by way of limitations. In the figures, like reference numerals refer to the same or similar elements.

DETAILED DESCRIPTION

Hereinafter, embodiments of one aspect of the present invention will be described with reference to the drawings. Each of the embodiments described below shows a specific example in one aspect of the present invention. Therefore, numerical values, shapes, materials, components, placement and connection of the components, processes (steps) and their order, and the like are mere examples and are not intended to limit one aspect of the present invention. Components in the following embodiments not mentioned in any of the independent claims that define the broadest concepts are described as optional elements.

Note that the drawings are schematic diagrams and do not necessarily provide strictly accurate illustrations. In the drawings, components that are substantially the same as components described previous thereto have the same reference numerals and overlapping descriptions may be omitted or simplified.

In the present specification, terminology indicating the relationship between elements, such as "parallel", terminology indicating the shape of an element, such as "rectangle", values, and value ranges do not only refer to their exact meanings, but include a range of relationships between elements, shapes, values, and value ranges that are essentially the same. For example, they include a margin of error of approximately a few percent.

In the drawings, the Z-axis is, for example, perpendicular to a light-receiving surface of a solar cell. The X-axis and the Y-axis are orthogonal to each other, and are both orthogonal to the Z-axis. For example, in the following embodiments, "plan view" refers to "seen along the Z-axis."

Embodiment

Hereinafter, the solar cell according to the present embodiment will be described with reference to FIG. 1A to FIG. 8.

1. Configuration of Solar Cell

A configuration of the solar cell according to the present embodiment will be first described with reference to FIG. 1A to FIG. 4.

Figure 1A:
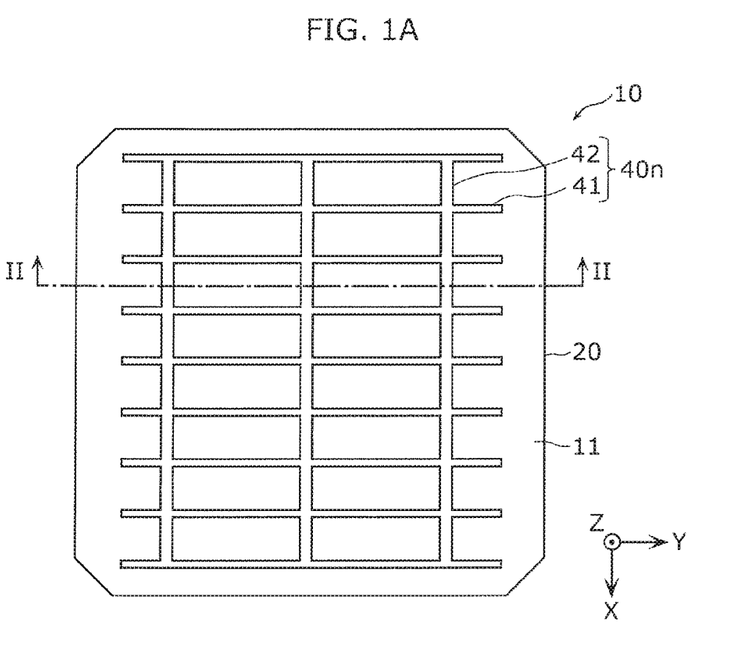
FIG. 1A is a plan view of a light-receiving surface of a solar cell according to an embodiment.
Figure 1B:
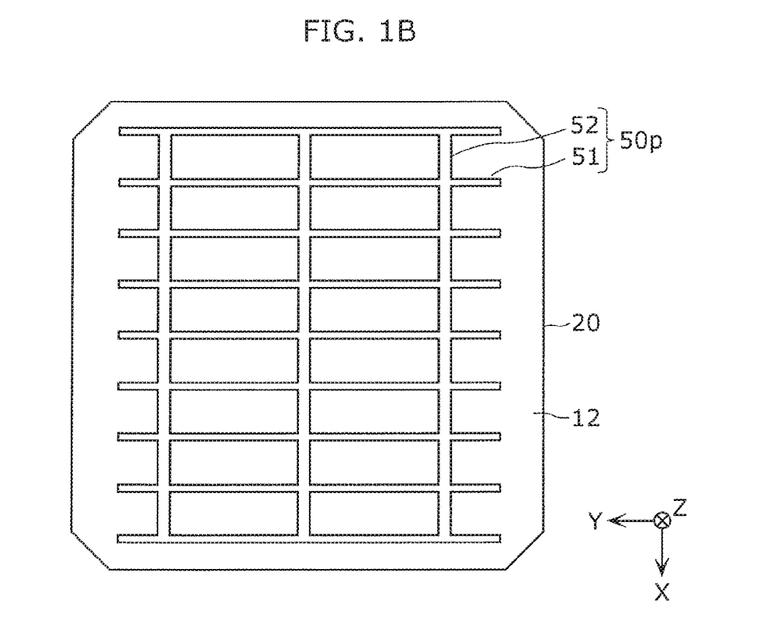
FIG. 1B is a plan view of a rear surface of the solar cell according to the embodiment.
Figure 2:
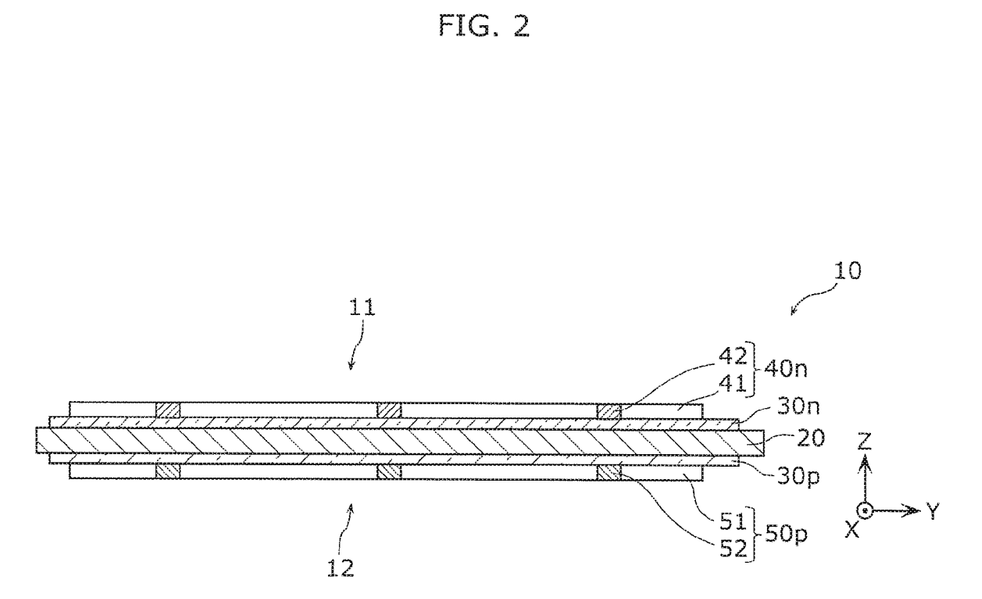
FIG. 2 is a cross-sectional view of the solar cell according to the embodiment along line II-II in FIG. 1A.

FIG. 1A is a plan view of a light-receiving surface 11 of a solar cell 10 according to the present embodiment. FIG. 1B is a plan view of a rear surface 12 of the solar cell 10 according to the present embodiment. FIG. 2 is a cross-sectional view of the solar cell 10 according to the embodiment along line II-II in FIG. 1A. Note that in FIG. 2, illustration of semiconductor layers formed on a silicon substrate 20 is omitted.

As illustrated in FIG. 1A and FIG. 1B, the solar cell 10 is rectangular in a plan view. For example, solar cell 10 has a square shape, sides of 125 mm, and cut-off corners. Note that the solar cell 10 is not limited to being rectangular.

As illustrated in FIG. 2, the solar cell 10 is a semiconductor p-n junction as its basic structure. The solar cell 10 includes, for example, the silicon substrate 20, an n-electrode 30n and an n-collector 40n sequentially formed on one main surface (positive end of the Z-axis) of the silicon substrate 20, and a p-electrode 30p and a p-collector 50p sequentially formed on another main surface (negative end of the Z-axis) of the silicon substrate 20. Note that in the present embodiment, the one main surface of the silicon substrate 20 is a main light-receiving surface of the solar cell 10 and is hereafter also recited as the light-receiving surface 11. The main light-receiving surface receives more than 50% of light incident on the solar cell 10 when a solar cell module is constructed using the solar cell 10. Note that in the present embodiment, the other main surface of the silicon substrate 20 faces away from the one main surface of the silicon substrate 20 and is hereafter also recited as the rear surface 12. The rear surface 12 is on a side opposite of the light-receiving surface 11. The light-receiving surface 11 of the silicon substrate 20 is an example of a first main surface, and the rear surface 12 of silicon substrate 20 is an example of a second main surface.

The silicon substrate 20 is a crystalline silicon substrate and is, for example, an n-type monocrystalline silicon substrate. Note that the silicon substrate 20 is not limited to being a monocrystalline silicon substrate (n-type monocrystalline silicon substrate or p-type monocrystalline silicon substrate), and may also be a polycrystalline silicon substrate, etc. Hereinafter, an example of the silicon substrate 20 being an n-type monocrystalline silicon substrate will be described. The silicon substrate 20 is an example of a semiconductor substrate. Note that in the present specification, "p-type" is also recited as "first conductivity type" and "n-type" as "second conductivity type." For example, the silicon substrate 20 is a silicon substrate of a second conductivity type. For example, the silicon substrate 20 is rectangular in the plan view, and has a thickness between 50 μm and 300 μm, and preferably at most 150 μm.

At least one the light-receiving surface 11 and the rear surface 12 of the silicon substrate 20 may be uneven (not illustrated) and have a so-called textured structure including multiple two-dimensional pyramids. This enables the solar cell 10 to increase light absorption, which contributes to the power generation, without having to increase the thickness of the silicon substrate 20 since it is possible to effectively increase an optical path length in the silicon substrate 20. The solar cell 10, for example, allows light having wavelengths with a low absorption coefficient to effectively contribute to the power generation in the silicon substrate 20.

Figure 3:
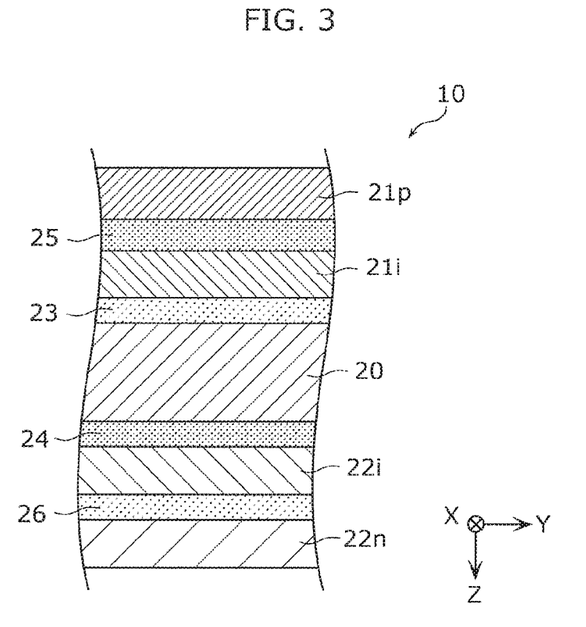
FIG. 3 is a cross-sectional view of a semiconductor substrate according to the embodiment along line II-II in FIG. 1A.

A configuration of the semiconductor layers disposed on the silicon substrate 20 will be described next with reference to FIG. 3 and FIG. 4. FIG. 3 is a cross-sectional view of the silicon substrate 20 according to the present embodiment along line II-II in FIG. 1A.

As illustrated in FIG. 3, the silicon substrate 20 includes a p-end intrinsic semiconductor layer 21i, a p-type semiconductor layer 21p, an n-end intrinsic semiconductor layer 22i, and an n-type semiconductor layer 22n. The other main surface of the silicon substrate 20 includes the p-end intrinsic semiconductor layer 21i and the p-type semiconductor layer 21p, and the one main surface of the silicon substrate 20 includes the n-end intrinsic semiconductor layer 22i and the n-type semiconductor layer 22n. For example, the n-end intrinsic semiconductor layer 22i and the n-type semiconductor layer 22n are disposed on the light-receiving surface 11 of the silicon substrate 20, and the p-end intrinsic semiconductor layer 21i and the p-type semiconductor layer 21p are disposed on the rear surface 12 of the silicon substrate 20, but are not limited thereto.

The p-end intrinsic semiconductor layer 21i and the n-end intrinsic semiconductor layer 22i are, for example, amorphous semiconductor layers formed using an intrinsic amorphous silicon thin film. The p-end intrinsic semiconductor layer 21i is an example of a second intrinsic semiconductor layer, and the n-end intrinsic semiconductor layer 22i is an example of a first intrinsic semiconductor layer. The p-type semiconductor layer 21p is, for example, an amorphous semiconductor layer formed using a p-type amorphous silicon thin film, and is an example of a second semiconductor layer. The n-type semiconductor layer 22n is, for example, an amorphous semiconductor layer formed using an n-type amorphous silicon thin film, and is an example of a first semiconductor layer. Note that amorphous silicon not only necessarily includes an amorphous material, but may also include a microcrystalline material, oxygen impurity, or carbon impurity.

The p-end intrinsic semiconductor layer 21i and the p-type semiconductor layer 21p are respectively laminated on the rear surface 12 of the silicon substrate 20. Note that laminated here means laminated in the negative direction of the Z-axis. The p-end intrinsic semiconductor layer 21i is a passivation layer disposed between the rear surface 12 of the silicon substrate 20 and the p-type semiconductor layer 21p. The p-end intrinsic semiconductor layer 21i can include amorphous silicon having a dopant content of less than $1 \times 10^{19}$ cm$^{-3}$. The p-type semiconductor layer 21p is disposed on the rear surface 12 of the silicon substrate 20, and is of a conductivity type different from the conductivity type of the silicon substrate 20. The p-type semiconductor layer 21p can include, for example, amorphous silicon having a p-type dopant, e.g. boron (B), content of at least $5 \times 10^{19}$ cm$^{-3}$.

The n-end intrinsic semiconductor layer 22i and the n-type semiconductor layer 22n are respectively laminated on the light-receiving surface 11 of the silicon substrate 20. Note that laminated here means laminated in the positive direction of the Z-axis. The n-end intrinsic semiconductor layer 22i is a passivation layer disposed between the light-receiving surface 11 of the silicon substrate 20 and the n-type semiconductor layer 22n. The n-end intrinsic semiconductor layer 22i can include amorphous silicon having a dopant content of less than $1 \times 10^{19}$ cm$^{-3}$. The n-type semiconductor layer 22n is disposed on the light-receiving surface 11 of the silicon substrate 20, and is of the same conductivity type as the silicon substrate 20. The n-type semiconductor layer 22n can include, for example, amorphous silicon having an n-type dopant, e.g. phosphorus (P) or arsenic (As), content of at least $5 \times 10^{19}$ cm$^{-3}$.

A thickness of the p-end intrinsic semiconductor layer 21i and the n-end intrinsic semiconductor layer 22i is not particularly limited as long as it does not substantially influence power generation. The thickness of the p-end intrinsic semiconductor layer 21i and the n-end intrinsic semiconductor layer 22i is, for example, between approximately several Å and 250 Å. A thickness of the p-type semiconductor layer 21p is, for example, between 2 nm and 50 nm. A thickness of the n-type semiconductor layer 22n is, for example, between 1 nm and 50 nm.

The solar cell 10 of the present application is characterized by a relationship of oxygen concentrations at interfaces between each of the above semiconductor layers. To be specific, a first oxygen concentration at a first interface 23 between the silicon substrate 20 and the p-end intrinsic semiconductor layer 21i is lower than a second oxygen concentration at an interface between the silicon substrate 20 and the n-end intrinsic semiconductor layer 22i. A third oxygen concentration at an interface between the p-end intrinsic semiconductor layer 21i and the p-type semiconductor layer 21p is higher than a fourth oxygen concentration at an interface between the n-end intrinsic semiconductor layer 22i and the n-type semiconductor layer 22n.

As stated above, in the solar cell 10, the oxygen concentration at the first interface 23 is low. The solar cell 10 has interfaces with a high oxygen concentration (e.g. the second interface 24 and the third interface 25) and interfaces with a low oxygen concentration (the first interface 23 and the fourth interface 26) at either side of the silicon substrate 20. In other words, in the solar cell 10, the oxygen concentration at the first interface 23 is low, and the oxygen concentrations at either side of the silicon substrate 20 have a front-rear symmetrical structure. This makes it possible to limit peeling of at least one of the p-end intrinsic semiconductor layer 21i and the n-end intrinsic semiconductor layer 22i from the silicon substrate 20 due to stress being concentrated on one side of the silicon substrate 20 more than when there is only an interface with a high oxygen concentration on the one main surface of the silicon substrate 20 and an interface with a low oxygen concentration on the other main surface of the silicon substrate 20. The solar cell 10 is, for example, capable of reducing the risk of warping of the silicon substrate 20. The solar cell 10 further prevents dopant diffusion from the p-type semiconductor layer 21p to the p-end intrinsic semiconductor layer 21i due to the high oxygen concentration at the third interface 25.

The first oxygen concentration is, for example, at least $1 \times 10^{20}$ cm$^{-3}$ and lower than $1 \times 10^{21}$ cm$^{-3}$, and the second oxygen concentration is at least $1 \times 10^{21}$ cm$^{-3}$ and lower than $1 \times 10^{22}$ cm$^{-3}$. the third oxygen concentration is at least $1 \times 10^{21}$ cm$^{-3}$ and lower than $1 \times 10^{22}$ cm$^{-3}$, and the fourth oxygen concentration is at least $1 \times 10^{20}$ cm$^{-3}$ and lower than $1 \times 10^{21}$ cm$^{-3}$. Note that the first oxygen concentration to the fourth oxygen concentration may each be specified as an oxygen atom area density (also recited as interface oxygen atom density). The first oxygen concentration (oxygen atom area density at the first interface 23) may be at least $5 \times 10^{13}$ cm$^{-2}$ and less than $6 \times 10^{14}$ cm$^{-2}$. The second oxygen concentration (oxygen atom area density at the second interface 24) may be at least $6 \times 10^{14}$ cm$^{-2}$ and less than $2 \times 10^{15}$ cm$^{-2}$. The third oxygen concentration (oxygen atom area density at the third interface 25) may be at least $6 \times 10^{14}$ cm$^{-2}$ and less than $2 \times 10^{15}$ cm$^{-2}$. The fourth oxygen concentration (oxygen atom area density at the fourth interface 26) may be at least $5 \times 10^{13}$ cm$^{-2}$ and less than $6 \times 10^{14}$ cm$^{-2}$.

This makes it possible to make a ratio of the oxygen concentration at the light-receiving surface 11 and the rear surface 12 of silicon substrate 20 lower than 10. In other words, it is possible to implement the solar cell 10 whose oxygen concentrations have the front-rear symmetrical structure. Note that the ratio of the oxygen concentration may be as close to 1 as possible. The ratio of the oxygen concentration may be, for example, at most 5. The ratio of the oxygen concentration is a value obtained, between a higher one of the first oxygen concentration and the oxygen concentration (in the present embodiment, the oxygen concentration) and a higher one of the second oxygen concentration and the fourth oxygen concentration (in the present embodiment, the second oxygen concentration), by dividing a higher oxygen concentration by a lower oxygen concentration (in the present embodiment, third oxygen concentration÷second oxygen concentration, or second oxygen concentration÷third oxygen concentration).

A measuring method of the oxygen concentration will be described next. A measuring method of a volume concentration, being an example of the oxygen concentration, will be described first using the first interface 23 as an example. The volume concentration is measured using secondary ion mass spectrometry (SIMS). SIMS is a method in which an accelerated and focused primary ion beam (e.g. cesium: Cs$^+$) is radiated on a specimen in a vacuum, secondary ions, among particles ejected from a surface of the specimen through sputtering, are extracted using an electric field, and a mass thereof is measured. For example, an oxygen (O) volume concentration is calculated by measuring the oxygen concentration from the p-end intrinsic semiconductor layer 21i in a depth direction (Z-axis) using SIMS.

A measuring method of an interface oxygen atom area density, being an example of the oxygen concentration, will be described next using the first interface 23 as an example. For example, the oxygen volume concentration is first calculated by measuring the oxygen concentration from the p-end intrinsic semiconductor layer 21i in the depth direction using SIMS. Then, a volume concentration is calculated, in the depth direction, from places where the oxygen concentration of the silicon substrate 20 and the p-end intrinsic semiconductor layer 21i around the first interface 23 reach a background level (e.g. 20 Å to 30 Å), the oxygen atom area density at the first interface 23 is output, and is made into the interface oxygen atom area density at the first interface 23. The interface oxygen atom density is calculated in the same way for the other interfaces.

It is also possible to measure the oxygen concentration at the first interface 23 by using SIMS on the surface of the silicon substrate 20 having a textured structure, but it possible to easily do this using the following method. To be specific, a p-end intrinsic semiconductor layer, a p-type semiconductor layer, an n-end intrinsic semiconductor layer, and an n-type semiconductor layer are formed on a flat surface of a monocrystalline silicon substrate not having a textured structure, and an oxygen concentration at an interface between the monocrystalline silicon substrate and the p-end intrinsic semiconductor layer is measured through SIMS. When the p-end intrinsic semiconductor layer 21$i$, the p-type semiconductor layer 21$p$, the n-end intrinsic semiconductor layer 22$i$, and the n-type semiconductor layer 22$n$ are formed on the silicon substrate 20 having a textured structure under the same circumstances as the p-end intrinsic semiconductor layer, the p-type semiconductor layer, the n-end intrinsic semiconductor layer, and the n-type semiconductor layer are formed on the flat surface of the monocrystalline silicon substrate, it is possible to assume that the oxygen concentration at the first interface 23 is equal to the oxygen concentration at the interface between the p-end intrinsic semiconductor layer, which is formed on the flat surface, and the monocrystalline silicon substrate.

Another example of the configuration of the semiconductor layers disposed on the silicon substrate 20 will be described next with reference to FIG. 4. FIG. 4 is a cross-sectional view of the other example of the silicon substrate 20 according to the present embodiment along line II-II in FIG. 1A.

Figure 4:
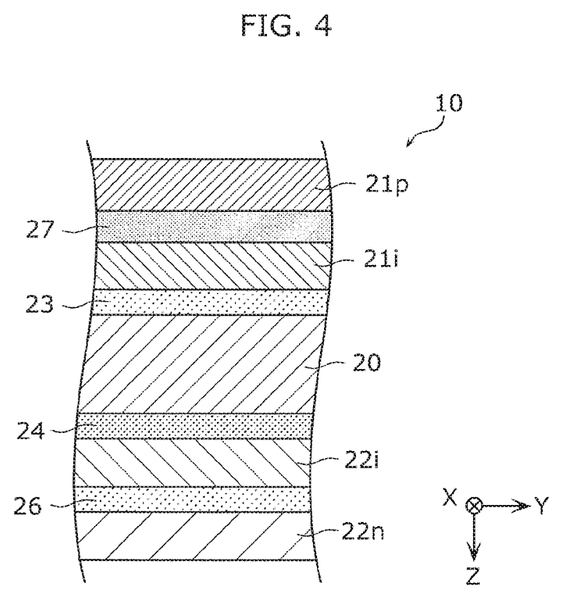
FIG. 4 is a cross-sectional view of another example of the semiconductor substrate according to the embodiment along line II-II in FIG. 1A.

As illustrated in FIG. 4, the solar cell 10 differs from the solar cell 10 shown in FIG. 3 in that a diffusion inhibition layer 27 is disposed at the interface between the p-end intrinsic semiconductor layer 21$i$ and the p-type semiconductor layer 21$p$. The diffusion inhibition layer 27 inhibits diffusion of a dopant of the p-type semiconductor layer 21$p$ toward the p-end intrinsic semiconductor layer 21$i$. The diffusion inhibition layer 27 includes oxygen, carbon, and nitrogen. The diffusion inhibition layer 27 includes, for example, SiOxCyNz. An oxygen concentration is at least $1 \times 10^{21}$ cm$^{-3}$ and lower than $1 \times 10^{22}$ cm$^{-3}$. A carbon concentration is at least $1 \times 10^{19}$ cm$^{-3}$ and lower than $1 \times 10^{20}$ cm$^{-3}$. A nitrogen concentration is at least $1 \times 10^{18}$ cm$^{-3}$ and lower than $1 \times 10^{19}$ cm$^{-3}$. The x, y, and z values are determined within the above concentrations.

In this case, the third oxygen concentration means the oxygen concentration of the diffusion inhibition layer 27. The oxygen concentration of the diffusion inhibition layer 27 is higher than the fourth oxygen concentration. A thickness of the diffusion inhibition layer 27 is, for example, between approximately several Å and 50 Å, and between 1 Å and 20 Å as a specific example. The thickness of the diffusion inhibition layer 27 is measured through cross-sectional observation of the cell using a transmission electron microscope (TEM). Note that the same applies to the other layers.

Referring back to FIG. 2, the n-electrode 30$n$ and the p-electrode 30$p$ are, for example, transparent conductive oxide (TCO) films including a transparent and conductive material. The TCFO films may, for example, include at least one type of metallic oxide having a polycrystalline structure, e.g. indium oxide (In$_2$O$_3$), zinc oxide (ZnO), tin oxide (SnO$_2$), and titanium oxide (TiO$_2$). These metallic oxides may be doped with tin (Sn), zinc (Zn), tungsten (W), antimony (Sb), titanium (Ti), aluminum (Al), cerium (Ce), gallium (Ga), etc., and may in particular be, for example, indium tin oxide (ITO) which is Sn doped with In$_2$O$_3$. A concentration of the dopant can be between 0% mass and 20% mass.

The n-electrode 30$n$ and the p-electrode 30$p$ are formed through vapor-deposition, sputtering, etc. The n-electrode 30$n$ is disposed on the n-type semiconductor layer 22$n$ and the p-electrode 30$p$ is disposed on the p-type semiconductor layer 21$p$.

The n-collector 40$n$ is an electrode that is disposed on the n-electrode 30$n$ and collects photoelectric charge (electrons) produced in a photoelectric region on the silicon substrate 20. The n-collector 40$n$ includes, for example, finger electrodes 41 that are linearly disposed perpendicular to the extension direction of wiring components (not illustrated), and busbar electrodes 42 that are connected to and linearly disposed perpendicular to the finger electrodes 41. The finger electrodes 41 are, for example, disposed parallel to one another. Each of the busbar electrodes 42 is, for example, connected to a corresponding one of the wiring components.

The p-collector 50$p$ is an electrode that is disposed on the p-electrode 30$p$ and collects photoelectric charge (electron holes) produced in the photoelectric region on the silicon substrate 20. The p-collector 50$p$ includes, for example, finger electrodes 51 that are linearly disposed perpendicular to the extension direction of wiring components (not illustrated), and busbar electrodes 52 that are connected to and linearly disposed perpendicular to the finger electrodes 51. Each of the busbar electrodes 52 is, for example, connected to a corresponding one of the wiring components.

The finger electrodes 41 and the finger electrodes 51 are parallel to one another in the plan view. The busbar electrodes 42 and the busbar electrodes 52 are parallel to one another in the plan view.

Note that the finger electrodes 41 and 51, and the busbar electrodes 42 and 52 are not particularly limited. At least one of each of the finger electrodes 41 and 51, and the busbar electrodes 42 and 52 may be disposed. For example, the number of busbar electrodes 42 and 52 may be the same as the number of wiring components and may also not be the same. In other words, the busbar electrodes 42 and 52 may be disposed to a corresponding one of the wiring components and may also not be disposed one-to-one. The number of busbar electrodes 42 may be the same as the number of busbar electrodes 52. In the present embodiment, there are three of each of busbar electrodes 42 and 52.

This enables the solar cell 10 to further limit peeling of at least one of the p-end intrinsic semiconductor layer 21$i$ and the n-end intrinsic semiconductor layer 22$i$ from the silicon substrate 20 due to a difference in stress applied by the busbar electrodes 42 and 52. The solar cell 10 is capable of, for example, further reducing the risk of warping of the silicon substrate 20.

Note that the wiring components are each tab wiring that electrically connect two adjacent solar cells 10 when forming the solar cell module. The n-collector 40$n$ and the p-collector 50$p$ are illustrated with the same shape, but are not limited thereto.

The n-collector 40$n$ and the p-collector 50$p$ include a low-resistance conductive material, e.g. silver (Ag). For example, the n-collector 40$n$ and the p-collector 50$p$ can be formed by screen printing, in a predetermined pattern, a conductive resin paste in which conductive filler, e.g. silver particles, is dispersed in a binder resin (e.g. silver paste).

Note that an example of the solar cell 10 is described above including the finger electrodes 41 and 51, and the busbar electrodes 42 and 52, but is not limited thereto. The solar cell 10 may also, for example, not include the busbar electrodes 42 and 52. In this case, first wiring (wire electrodes) that is not illustrated may be disposed instead of the busbar electrodes 42 and 52. The first wiring is connected to the finger electrodes (e.g. finger electrodes 41) disposed on the solar cell 10 via a conductive adhesive, etc., and is linearly disposed along a direction that intersects the finger electrodes. The first wiring is, for example, disposed along a direction that is perpendicular to the finger electrodes. The first wiring further collects carriers collected by the finger electrodes.

The first wiring included in each of adjacent solar cells 10 may be, for example, electrically connected via second wiring (not illustrated) that is different from the first wiring. For example, the second wiring electrically connects (i) an end portion of the first wiring disposed on the light-receiving surface 11 of one solar cell 10 of two adjacent solar cells 10, and (ii) an end portion of the first wiring disposed on the rear surface 12 of another solar cell 10 of the two adjacent solar cells 10. The second wiring is an example of the wiring component. Note that the first wiring and the second wiring may be formed integrally.

As stated above, the solar cell 10 according to the present embodiment is, for example, a heterojunction solar cell. With this, imperfections are reduced in the interface between the silicon substrate 20 and the n-type semiconductor layer 22n, and the interface between the silicon substrate 20 and the p-type semiconductor layer 21p (heterojunction interface). It is therefore possible to improve the photoelectric conversion efficiency of the solar cell 10.

Note that the passivation layers are not limited to being intrinsic amorphous silicon layers, and may also be silicon oxide layers, silicon nitride layers, silicon oxynitride layer, etc. Both or either one of the p-end intrinsic semiconductor layer 21i and the n-end intrinsic semiconductor layer 22i may be replaced with a silicon oxide layer, a silicon nitride layer, or a silicon oxynitride layer.

2. Method for Manufacturing Solar Cell

Figure 5:
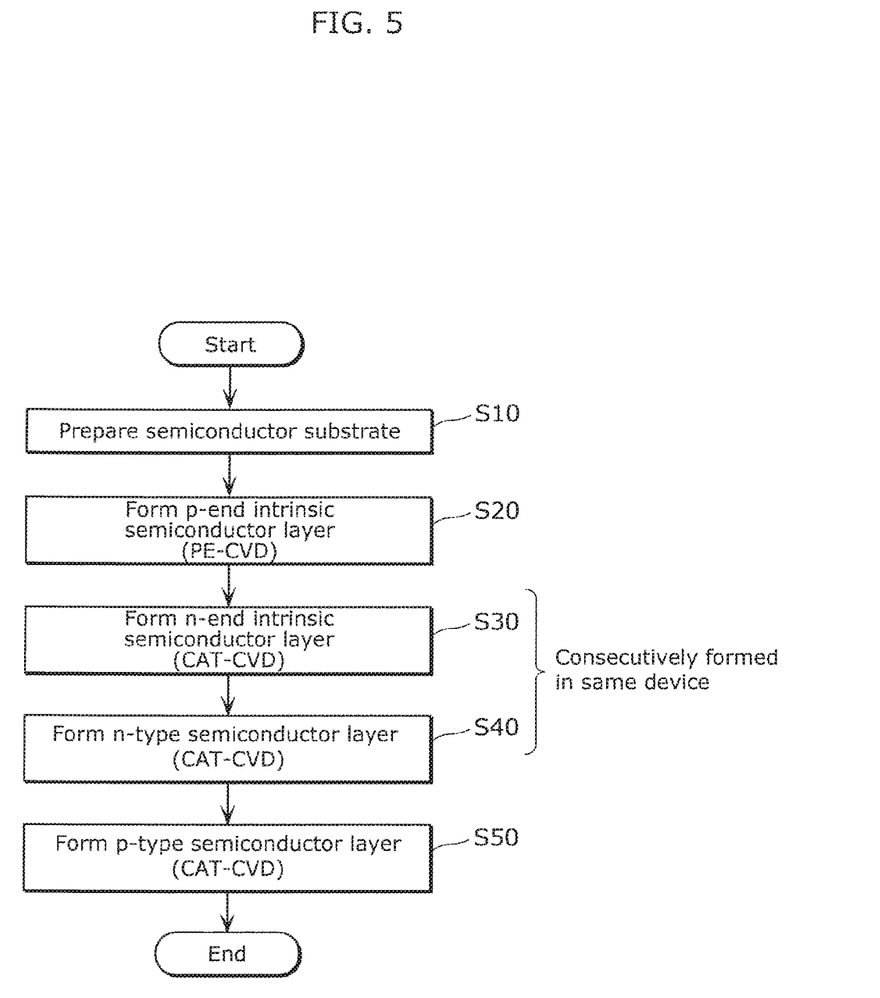
FIG. 5 is a flowchart showing a first example of a method for manufacturing the solar cell according to the embodiment.

A method for manufacturing the solar cell 10 according to the present embodiment will be described next with reference to FIG. 5 to FIG. 8. FIG. 5 is a flowchart showing a first example of the method for manufacturing the solar cell according to the present embodiment.

As illustrated in FIG. 5, the semiconductor substrate is first prepared (S10). In other words, the silicon substrate 20 is prepared. Multiple silicon substrates 20 are, for example, disposed in a deposition tray. The p-end intrinsic semiconductor layer 21i is then formed on the silicon substrate 20 (S20). In step S20, the p-end intrinsic semiconductor layer 21i is formed on the other main surface of the silicon substrate 20. The p-end intrinsic semiconductor layer 21i is formed through plasma-enhanced chemical vapor deposition (PE-CVD) or catalytic chemical vapor deposition (CAT-CVD).

PE-CVD is a method in which material gas is caused to flow into a film-forming chamber (vacuum container) including a plasma source, and by supplying the plasma source with electric power from a power source, discharge plasma is produced in the film-forming chamber, the material gas is decomposed with the plasma, and the generated reactive species is deposited on an object (e.g. the silicon substrate 20). CAT-CVD is a method in which material gas is caused to flow into a film-forming chamber in which a wire (catalyst) made of tungsten and the like is disposed, the material gas is catalytically decomposed with the wire that is electrically heated by a power source, and the generated reactive species (decomposition species) is deposited on an object.

With the objective of reducing the first oxygen concentration at the first interface 23, the p-end intrinsic semiconductor layer 21i may also be formed through PE-CVD. With the objective of limiting interface imperfections and controlling the interface oxygen concentrations, PE-CVD, which excels in controllability of interface structure, is suitable for the p-end intrinsic semiconductor layer 21i. This makes it possible to improve a fill factor (FF) of the solar cell 10 since it is possible to limit an increase in resistance at the first interface 23 by reducing the first oxygen concentration that greatly influences an output of the solar cell 10. Hereinafter, an example of the p-end intrinsic semiconductor layer 21i formed through PE-CVD will be described.

Note that for PE-CVD, any of radio frequency (RF) plasma CVD, very high frequency (VHF) plasma CVD, microwave plasma CVD, etc. may be used. In the present embodiment, the p-end intrinsic semiconductor layer 21i is formed through, for example, RF plasma CVD.

The film-forming device and deposition tray used in step S20 may be different from the film-forming device and deposition tray used from step S30. In other words, only the p-end intrinsic semiconductor layer 21i may be formed using a separate film-forming device and deposition tray. This makes it possible to limit boron being struck out from the deposition tray and deposited on the silicon substrate 20 during the forming of the p-end intrinsic semiconductor layer 21i. In other words, it is possible to improve an open-circuit voltage ($V_{OC}$) of the solar cell 10 since it is possible to limit autodoping of boron to the first interface 23.

In step S20, a gas containing silicon and being diluted with hydrogen, e.g. silane ($SiH_4$), is supplied to the film-forming chamber as the material gas, and the gas is ionized by applying RF power to parallel-plate electrodes disposed in the film-forming chamber. The p-end intrinsic semiconductor layer 21i is formed by supplying this ionized gas to the second main surface of the silicon substrate 20 that is heated up at least 150° C. and at most 250° C.

The n-end intrinsic semiconductor layer 22i is then formed on the one main surface of the silicon substrate 20 (S30). In other words, the n-end intrinsic semiconductor layer 22i is formed after the p-end intrinsic semiconductor layer 21i is formed on the silicon substrate 20. In the present embodiment, the n-end intrinsic semiconductor layer 22i is formed through CAT-CVD with the objective of increasing productivity.

The silicon substrate 20 is, for example, taken out of the PE-CVD film-forming device after the p-end intrinsic semiconductor layer 21i is formed through PE-CVD, and is turned upside down and disposed in the deposition tray so that the one main surface of the silicon substrate 20 is exposed. At this point, an oxide layer is formed on the one main surface of the silicon substrate 20 by exposing the one main surface to the atmosphere (air) while being at a high temperature. The solar cell 10, which includes the second interface 24 having a higher oxygen concentration than the first interface 23, is formed in this state by forming the n-end intrinsic semiconductor layer 22i. It is possible to further increase the oxygen concentration at the second interface 24 by forming the n-end intrinsic semiconductor layer 22i through CAT-CVD.

In step S30, a gas containing silicon and being diluted with hydrogen, e.g. silane ($SiH_4$), is supplied to the film-forming chamber as the material gas, and the gas is decomposed at a surface of the wire that is disposed in the film-forming chamber and electrically heated. The n-end intrinsic semiconductor layer 22i is formed by supplying this decomposed gas on the first main surface of the heated up silicon substrate 20. In step S30, the silicon substrate 20 may be transferred to a tray for depositing through CAT-CVD or a tray for forming the n-type semiconductor layer 22n.

The n-type semiconductor layer 22n is formed then on the n-end intrinsic semiconductor layer 22i (S40). The n-type semiconductor layer 22n may be formed through CAT-CVD with the objective of increasing productivity. For example, the n-type semiconductor layer 22n is formed next after the n-end intrinsic semiconductor layer 22i is formed through CAT-CVD. In other words, the n-end intrinsic semiconductor layer 22i and the n-type semiconductor layer 22n are formed consecutively with the same device. For example, steps S30 and S40 are performed consecutively in the same device without taking out the deposition tray out of the device. With this, the oxygen concentration at the fourth interface 26 is lower than the oxygen concentration at the second interface 24.

In step S40, a mixed gas including a gas containing silicon and being diluted with hydrogen, e.g. silane ($SiH_4$), and a gas containing an n-type dopant and being diluted with hydrogen, e.g. phosphine ($PH_3$), is supplied to the film-forming chamber as the material gas, and the gas is decomposed at the surface of the wire that is disposed in the film-forming chamber and electrically heated. The n-type semiconductor layer 22n is formed by supplying this decomposed gas on the n-end intrinsic semiconductor layer 22i of the heated up silicon substrate 20.

The p-type semiconductor layer 21p is then formed (S50). In other words, out of the p-end intrinsic semiconductor layer 21i, the p-type semiconductor layer 21p, the n-end intrinsic semiconductor layer 22i, and the n-type semiconductor layer 22n, the p-type semiconductor layer 21p is formed last. By forming the p-type semiconductor layer 21p last, it is possible to limit autodoping of boron to the first interface 23, the second interface 24, and the fourth interface 26. In other words, it is possible to limit a reduction in the $V_{OC}$ of the solar cell 10.

The p-type semiconductor layer 21p may be formed through CAT-CVD with the objective of increasing productivity. The silicon substrate 20 is, for example, taken out of the CAT-CVD film-forming device after the n-type semiconductor layer 22n is formed through CAT-CVD, and is turned upside down and disposed in the deposition tray so that the other main surface of the silicon substrate 20 (surface on which the p-end intrinsic semiconductor layer 21i is formed) is exposed. At this point, an oxide layer is formed on the other main surface of the silicon substrate 20 by exposing the other main surface to the atmosphere while being at a high temperature. To be specific, oxygen is deposited on the p-end intrinsic semiconductor layer 21i. The solar cell 10, which includes the third interface 25 having a higher oxygen concentration than the fourth interface 26, is formed in this state by forming the p-type semiconductor layer 21p. It is possible to further increase the oxygen concentration at the third interface 25 by forming the p-type semiconductor layer 21p through CAT-CVD.

In step S50, a mixed gas including a gas containing silicon and being diluted with hydrogen, e.g. silane ($SiH_4$), and a gas containing a p-type dopant and being diluted with hydrogen, e.g. diborane ($B_2H_6$), is supplied to the film-forming chamber as the material gas, and the gas is decomposed at the surface of the wire that is disposed in the film-forming chamber and electrically heated. The p-type semiconductor layer 21p is formed by supplying this decomposed gas on the p-end intrinsic semiconductor layer 21i of the heated up silicon substrate 10. In step S50, the silicon substrate 20 may be transferred to a tray for forming the p-type semiconductor layer 21p, but the same deposition tray used in steps S30 and S40 may also be used as-is.

As described above, it is possible to limit (i) autodoping of boron by separately forming the p-end intrinsic semiconductor layer 21i and (ii) an increase in contact resistance between the silicon substrate 20 and the p-end intrinsic semiconductor layer 21i by reducing the first oxygen concentration at the first interface 23. In other words, the above method makes it possible to manufacture a solar cell 10 that improves the $V_{OC}$ and FF thereof while limiting a reduction in productivity. Note that separately forming the p-end intrinsic semiconductor layer 21i includes at least one of forming only the p-end intrinsic semiconductor layer 21i (i) through PE-CVD and (ii) using a dedicated film-forming device and deposition tray.

Note that when the silicon substrate 20 is turned upside down and disposed in the deposition tray in step S50, carbon and nitrogen may be deposited on the p-end intrinsic semiconductor layer 21i exposed to the atmosphere in addition to the forming of the oxide layer. When forming the p-type semiconductor layer 21p in this state, the diffusion inhibition layer 27 including oxygen, carbon, and nitrogen is formed between the p-end intrinsic semiconductor layer 21i and the p-type semiconductor layer 21p. In other words, the solar cell 10 shown in FIG. 4 is formed. When forming the p-type semiconductor layer 21p after removing the carbon and nitrogen deposited on the p-end intrinsic semiconductor layer 21i, the solar cell 10 shown in FIG. 3 is formed.

Figure 6:
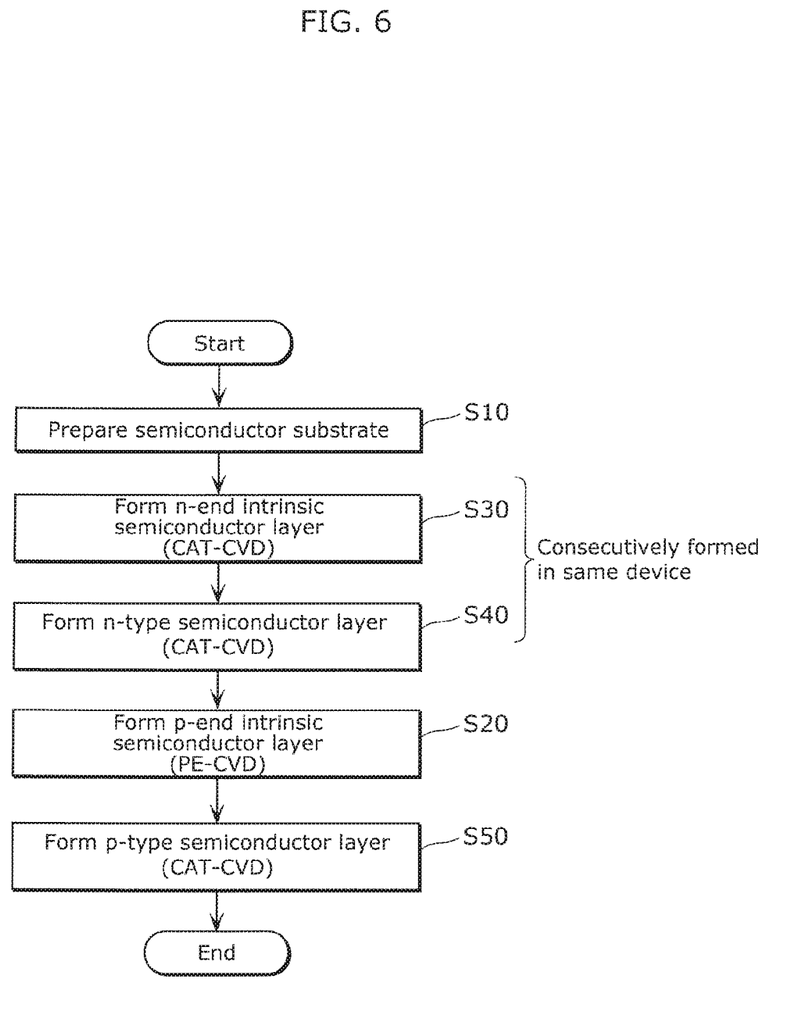
FIG. 6 is a flowchart showing a second example of the method for manufacturing the solar cell according to the embodiment.

Note that the method for manufacturing the solar cell 10 is not limited to the foregoing. To be specific, an order of forming each of the semiconductor layers (S20 to S50) is not limited to the foregoing. Other examples of the method for manufacturing the solar cell 10 will be described with reference to FIG. 6 to FIG. 8. FIG. 6 is a flowchart showing a second example of the method for manufacturing the solar cell 10 according to the present embodiment.

As illustrated in FIG. 6, the p-end intrinsic semiconductor layer 21i may be formed in step S20 after the n-end intrinsic semiconductor layer 22i and the n-type semiconductor layer 22n are respectively formed in steps S30 and S40 on the silicon substrate 20 prepared in step S10. In this case, the p-end intrinsic semiconductor layer 21i is formed through PE-CVD after the n-end intrinsic semiconductor layer 22i and the n-type semiconductor layer 22n are formed through CAT-CVD. This makes it possible to make the oxygen concentration at the first interface 23 between the silicon substrate 20 and the p-end intrinsic semiconductor layer 21i lower than the oxygen concentration at the second interface 24 between the silicon substrate 20 and the n-end intrinsic semiconductor layer 22i. The p-type semiconductor layer 21p is then formed on the p-end intrinsic semiconductor layer 21i (S50).

As stated above, the solar cell 10 may be formed by respectively laminating the p-end intrinsic semiconductor layer 21i and the p-type semiconductor layer 21p on the other main surface of the silicon substrate 20 after respectively laminating the n-end intrinsic semiconductor layer 22i and the n-type semiconductor layer 22n on the one main surface of the silicon substrate 20. Out of the p-end intrinsic semiconductor layer 21i, the p-type semiconductor layer 21p, the n-end intrinsic semiconductor layer 22i, and the n-type semiconductor layer 22n, p-end intrinsic semiconductor layer 21i is then formed separately. Note that separately forming the p-end intrinsic semiconductor layer 21i includes at least one of forming only the p-end intrinsic semiconductor layer 21i (i) through PE-CVD and (ii) using a dedicated film-forming device and deposition tray.

Note that in FIG. 6, a dedicated film-forming device and deposition tray may be used when forming the p-end intrinsic semiconductor layer 21i through CAT-CVD. In this case, a process in which the oxide layer on the rear surface 12 of the silicon substrate 20 is removed may be included between step S40 and step S20.

Figure 7:
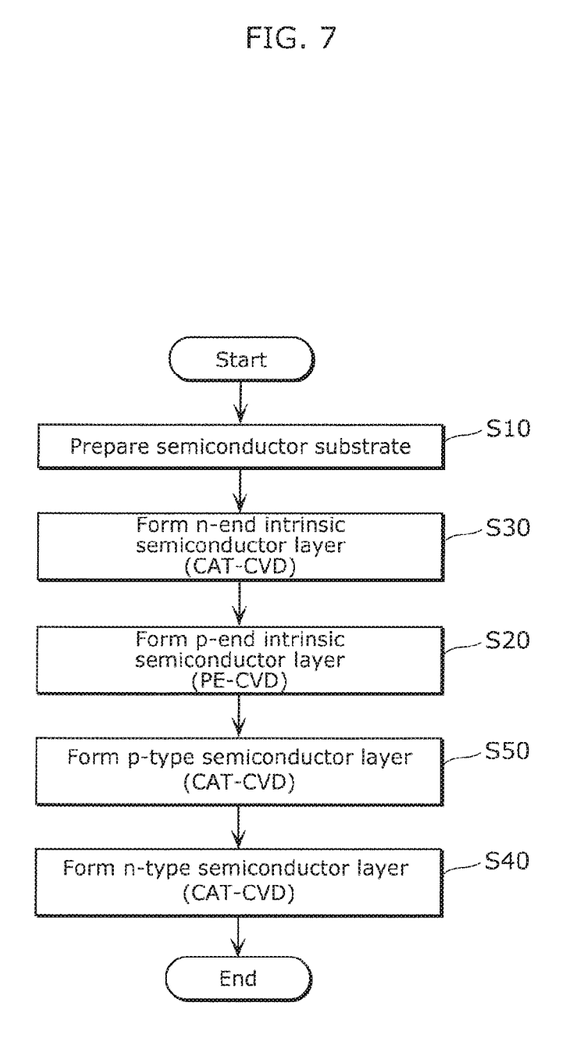
FIG. 7 is a flowchart showing a third example of the method for manufacturing the solar cell according to the embodiment.

FIG. 7 is a flowchart showing a third example of the method for manufacturing the solar cell 10 according to the present embodiment.

As illustrated in FIG. 7, the p-type semiconductor layer 21p and the n-type semiconductor layer 22n may be respectively formed in steps S50 and S40 after the n-end intrinsic semiconductor layer 22i and the p-end intrinsic semiconductor layer 21i are respectively formed in steps S30 and S20 on the silicon substrate 20 prepared in step S10. In this case, the p-type semiconductor layer 21p is formed in step S50 after the p-end intrinsic semiconductor layer 21i is formed in step S20, but in a CAT-CVD film-forming device that forms the p-type semiconductor layer 21p, a mixed gas including (i) a gas containing oxygen, e.g. oxygen, carbon dioxide, or water, (ii) a gas containing silicon and being diluted with hydrogen, e.g. silane (SiH$_4$), and (iii) a gas containing a p-type dopant and being diluted with hydrogen, e.g. diborane (B$_2$H$_6$), may supplied to the film-forming chamber as the material gas. This makes it possible to more easily make the oxygen concentration at the third interface 25 between the p-end intrinsic semiconductor layer 21i and the p-type semiconductor layer 21p higher than the oxygen concentration at the fourth interface 26 between the n-type semiconductor layer 22n and the n-end intrinsic semiconductor layer 22i formed after the p-type semiconductor layer 21p.

Figure 8:
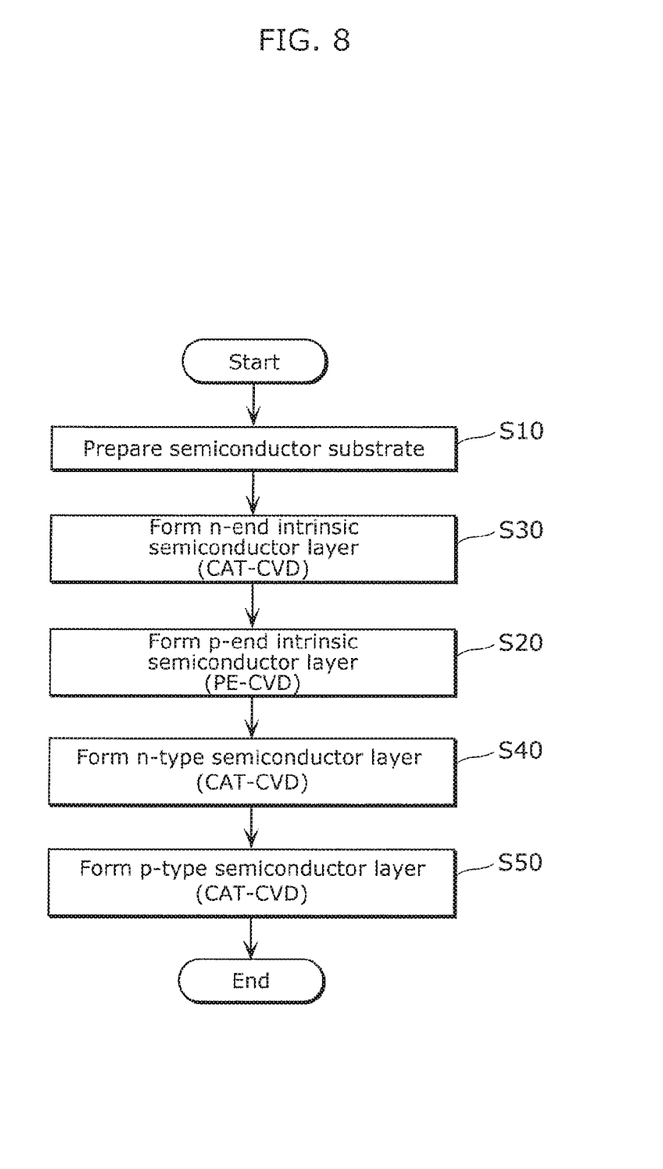
FIG. 8 is a flowchart showing a fourth example of the method for manufacturing the solar cell according to the embodiment.

FIG. 8 is a flowchart showing a fourth example of the method for manufacturing the solar cell 10 according to the present embodiment. Note that in the flowchart shown in FIG. 8, since processes up until step S20 are the same as the processes in FIG. 7, description thereof is omitted.

As illustrated in FIG. 8, the n-type semiconductor layer 22n and the p-type semiconductor layer 21p may be respectively formed in steps S40 and S50 after the n-end intrinsic semiconductor layer 22i and the p-end intrinsic semiconductor layer 21i are formed on the silicon substrate 20. This makes it possible to make, in a CAT-CVD film-forming device that forms the n-type semiconductor layer 22n, the oxygen concentration at the third interface 25 higher than the oxygen concentration at the fourth interface 26 without having to supply a gas containing oxygen, e.g. oxygen, carbon dioxide, or water, to the film-forming chamber as the material gas.

As illustrated in FIG. 7 and FIG. 8, each of the semiconductor layers formed on the silicon substrate 20 do not need to be formed consecutively with the same device. In other words, each of the semiconductor layers formed on the silicon substrate 20 may be formed by releasing the vacuum of the film-forming device and taking the silicon substrate 20 out of the device after forming one semiconductor layer.

3. Advantageous Effects, Etc.

As described above, the solar cell 10 according to the present embodiment includes: the silicon substrate 20 that includes n-type (example of the first conductivity type) crystalline silicon and has the light-receiving surface 11 (example of the first main surface) and rear surface 12 (example of the second main surface) facing away from the light-receiving surface 11; the n-type semiconductor layer 22n (example of the first semiconductor layer) that includes an n-type amorphous silicon thin film and is disposed above the light-receiving surface 11; the n-end intrinsic semiconductor layer 22i (example of the first intrinsic semiconductor layer) that includes an intrinsic amorphous silicon thin film and is disposed between the light-receiving surface 11 and the n-type semiconductor layer 22n; the p-type (example of the second conductivity type) semiconductor layer 21p (example of the second semiconductor layer) that includes a p-type amorphous silicon thin film and is disposed on the rear surface 12; and the p-end intrinsic semiconductor layer 21i (example of the second intrinsic semiconductor layer) that includes an intrinsic amorphous silicon thin film and is disposed between the rear surface 12 and the p-type semiconductor layer 21p. The first oxygen concentration at the interface between the silicon substrate 20 and the p-end intrinsic semiconductor layer 21i is lower than the second oxygen concentration at the interface between the silicon substrate 20 and the n-end intrinsic semiconductor layer 22i. The third oxygen concentration at the interface between the p-end intrinsic semiconductor layer 21i and the p-type semiconductor layer 21p is higher than the fourth oxygen concentration at the interface between the n-end intrinsic semiconductor layer 22i and the n-type semiconductor layer 22n.

This makes it possible to improve the FF of the solar cell 10 since it is possible to limit an increase in resistance at the first interface 23 which greatly influences the output of the solar cell 10. Due to the oxygen concentrations at either side of the silicon substrate 20 having the front-rear symmetrical structure, stress is concentrated on one side of the silicon substrate 20, making it possible to limit peeling of at least one of the p-end intrinsic semiconductor layer 21i and the n-end intrinsic semiconductor layer 22i from the silicon substrate 20. As such, the solar cell 10 according to the present embodiment is capable of limiting peeling of the silicon substrate 20 and the intrinsic semiconductor layers (e.g. p-end intrinsic semiconductor layer 21i and n-end intrinsic semiconductor layer 22i) along with improving power generation efficiency.

The first oxygen concentration is at least $1\times10^{20}$ cm$^{-3}$ and lower than $1\times10^{21}$ cm$^{-3}$, the second oxygen concentration is at least $1\times10^{21}$ cm$^{-3}$ and lower than $1\times10^{22}$ cm$^{-3}$, the third oxygen concentration is at least $1\times10^{21}$ cm$^{-3}$ and lower than $1\times10^{22}$ cm$^{-3}$, and the fourth oxygen concentration is at least $1\times10^{20}$ cm$^{-3}$ and lower than $1\times10^{21}$ cm$^{-3}$.

This makes it possible to further make the oxygen concentration at either side of the silicon substrate 20 more front-rear symmetrical. It is possible to improve power generation efficiency more than when the first oxygen concentration is at least $1\times10^{21}$ cm$^{-3}$ due to the first oxygen concentration being at least $1\times10^{20}$ cm$^{-3}$ and less than $1\times10^{21}$ cm$^{-3}$. As such, it is possible to implement the solar cell 10 that is capable of further improving power generation efficiency and limiting peeling of the silicon substrate 20 and the intrinsic semiconductor layers.

The solar cell 10 further includes the diffusion inhibition layer 27 that inhibits diffusion of the dopant of the p-type semiconductor layer 21p at the interface between the p-end intrinsic semiconductor layer 21i and the p-type semiconductor layer 21p. The diffusion inhibition layer 27 includes oxygen, carbon, and nitrogen.

This makes it possible to limit diffusion of the dopant of the p-type semiconductor layer 21p more than when the third interface 25 between the p-end intrinsic semiconductor layer 21i and the p-type semiconductor layer 21p does not substantially include carbon and nitrogen. In other words, it is possible to limit a reduction in the $V_{OC}$ caused by the dopant of the p-type semiconductor layer 21p diffusing to the p-end intrinsic semiconductor layer 21i and the first interface 23.

The first conductivity type is n-type conductivity and the second conductivity type is p-type conductivity.

This makes it possible to improve power generation efficiency and to limit peeling of the silicon substrate 20 and the intrinsic semiconductor layers in the solar cell 10 including the silicon substrate 20 made of n-type crystalline silicon.

Variation

Hereinafter, the solar cell according to a variation will be described with reference to the drawings. In the present variation, the p-end intrinsic semiconductor layer of the solar cell is formed through PE-CVD. Hereafter, a configuration of the solar cell when the p-end intrinsic semiconductor layer is formed through PE-CVD will be described with reference to FIG. 9 and FIG. 10. Note that in FIG. 9 and FIG. 10, the solar cell 10 is illustrated with the first interface to the fourth interface omitted for convenience sake.

Figure 9:
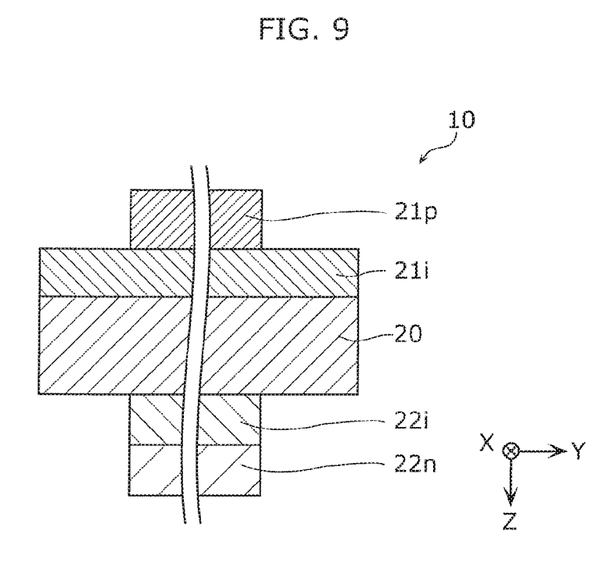
FIG. 9 is an example of a cross-sectional view of the solar cell according to a variation of the embodiment corresponding to line II-II in FIG. 1A.

FIG. 9 is an example of a cross-sectional view of the solar cell 10 according to the variation corresponding to line II-II in FIG. 1A.

As illustrated in FIG. 9, when forming the p-end intrinsic semiconductor layer 21i through PE-CVD, it is possible to form, among each of the semiconductor layers formed on the silicon substrate 20, only the p-end intrinsic semiconductor layer 21i up to end portions of the silicon substrate 20 since it is possible to do this without using a mask for fixing the silicon substrate 20. Note that it is not illustrated, but the p-end intrinsic semiconductor layer 21i may be formed up to the end portions of the silicon substrate 20 and lateral surfaces of the silicon substrate 20. This makes it possible to further limit peeling of the p-end intrinsic semiconductor layer 21i and the silicon substrate 20 by forming the p-end intrinsic semiconductor layer 21i up to the lateral surfaces of the silicon substrate 20. To be specific, this makes it possible to further limit peeling of the p-end intrinsic semiconductor layer 21i from a periphery of the silicon substrate 20.

However, when forming the n-end intrinsic semiconductor layer 22i and the like through CAT-CVD, a mask is used for fixing the silicon substrate 20 to the deposition tray. The silicon substrate 20 is fixed to the deposition tray by, for example, pressing down each outer edge of the silicon substrate 20 at either side of the silicon substrate 20 using a mask. Accordingly, when the p-type semiconductor layer 21p is formed through CAT-CVD, there are no semiconductor layers formed on a periphery of the silicon substrate 20 since the p-type semiconductor layer 21p is formed using a mask for fixing the silicon substrate 20. In other words, an area of the p-end intrinsic semiconductor layer 21i is larger than an area of the n-end intrinsic semiconductor layer 22i in the plan view of the silicon substrate 20. Note that multiple silicon substrates 20 are fixed to the deposition tray.

High productivity is desirable for the manufacturing of the solar cell 10. CAT-CVD has higher productivity than PE-CVD since its material gas decomposition efficiency and doping efficiency are higher. Thus, with the objective of increasing productivity, CAT-CVD may be used over PE-CVD. In the present variation, the p-type semiconductor layer 21p, the n-end intrinsic semiconductor layer 22i, and the n-type semiconductor layer 22n are formed through CAT-CVD. With the objective of reducing the oxygen concentration at the interface, PE-CVD may be used over CAT-CVD. In the present variation, the p-end intrinsic semiconductor layer 21i is formed through PE-CVD. This makes it possible to reduce the oxygen concentration at the first interface 23 between the silicon substrate 20 and the p-end intrinsic semiconductor layer 21i that has the largest influence on the output of the solar cell 10, while maintaining productivity of the solar cell 10.

Figure 10:
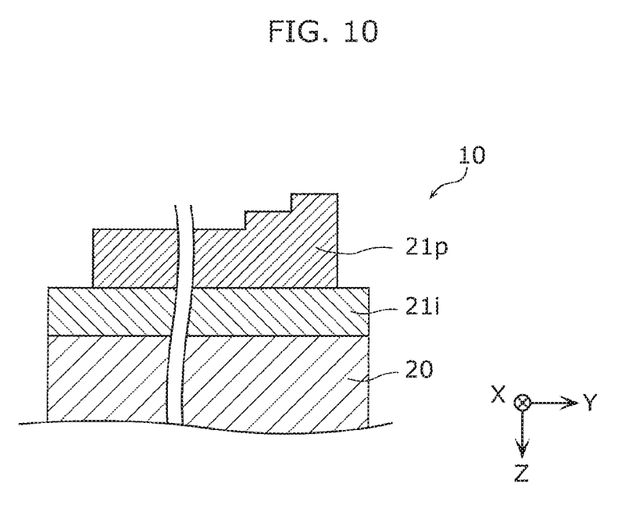
FIG. 10 is another example of the cross-sectional view of the solar cell according to the variation of the embodiment corresponding to line II-II in FIG. 1A.

FIG. 10 is another example of the cross-sectional view of the solar cell 10 according to the present variation corresponding to line II-II in FIG. 1A. It is possible to form layers having a more even film thickness with PE-CVD than with CAT-CVD.

As illustrated in FIG. 10, the p-end intrinsic semiconductor layer 21i is formed through PE-CVD, and the p-end intrinsic semiconductor layer 21i has a more even thickness than the p-type semiconductor layer 21p when the p-type semiconductor layer 21p is formed through CAT-CVD. In other words, the film thickness of the p-end intrinsic semiconductor layer 21i is less uneven than the film thickness of the p-type semiconductor layer 21p. The example of FIG. 10 shows the p-end intrinsic semiconductor layer 21i with an even thickness, and the p-type semiconductor layer 21p having an end portion at the positive end of the Y-axis that is thicker than its other portions (e.g. end portion at the negative end of the Y-axis). Note that the position at which the p-type semiconductor layer 21p is thicker is not limited to the end portion at the positive end of the Y-axis. The p-type semiconductor layer 21p is not limited to being thicker, but, for example, the end portion at the positive end of the Y-axis may also be thinner than its other portions.

It is not illustrated in FIG. 10, but the film thickness of the p-end intrinsic semiconductor layer 21i is less uneven than the film thickness of the n-end intrinsic semiconductor layer 22i and the film thickness of the n-type semiconductor layer 22n. Note that "film thickness is not uneven" may be, for example, that a difference between a maximum value and a minimum value of the film thickness is small, and that a standard deviation of the film thickness is small.

As described above, the area of the p-end intrinsic semiconductor layer 21i of the solar cell 10 according to the present variation is larger than the area of the n-end intrinsic semiconductor layer 22i in the plan view of the silicon substrate 20.

This makes it possible to limit recombination of generated carriers (e.g. electron holes) more than when the p-end intrinsic semiconductor layer 21i is formed through CAT-CVD. As such, it is possible to further improve power generation efficiency of the solar cell 10.

The film thickness of the p-end intrinsic semiconductor layer 21i is less uneven than the film thickness of the p-type semiconductor layer 21p.

This makes it possible to limit a reduction in the output of the solar cell 10 caused by unevenness in the film thickness of the p-end intrinsic semiconductor layer 21i.

Other Embodiments

The solar cell according to one aspect of the present invention is described above based on the embodiment and the variation (hereafter also referred to as the embodiment and the like), but the one aspect of the present invention is not limited thereto.

For example, in the above embodiment and the like, an example is described in which the n-type semiconductor layer is formed on the light-receiving surface of the solar cell, but is not limited thereto. The p-type semiconductor layer may also be formed on the light-receiving surface of the solar cell.

In the above embodiment and the like, an example is described in which the collectors include both finger electrodes and busbar electrodes, but are not limited thereto. The collectors may also include at least only the busbar electrodes.

One aspect of the present invention may be realized as a solar cell module including multiple solar cells and wiring components that electrically connect adjacent solar cells. In this case, at least one of the multiple solar cells included in the solar cell module is the solar cell recited in the above embodiment and the like.

The order of the processes in the method for manufacturing the solar cell described in the above embodiment and the like is an example and is not limited to the foregoing. The order of the processes may be changed and a portion of the processes may also not be performed.

The processes in the method for manufacturing the solar cell described in the above embodiment and the like may be performed as one single process or as separate processes. Note that performing the processes as one single process includes performing the processes using one device, performing the processes consecutively, or performing the processes in the same place. Performing the processes as separate processes includes performing the processes using separate devices, performing the processes at different times (e.g. on different days), or performing the processes in different places.

Additionally, forms realized by optionally combining components and functions in the embodiments that can be conceived by a person skilled in the art which are within the scope of the essence of the one aspect of present invention are also included in the scope of the one aspect of the present invention.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

The invention claimed is:

1. A solar cell, comprising:
a semiconductor substrate that includes crystalline silicon of a first conductivity type, and has a first main surface and a second main surface facing away from the first main surface;
a first semiconductor layer that includes an amorphous silicon thin film of the first conductivity type, and is disposed above the first main surface;
a first intrinsic semiconductor layer that includes an intrinsic amorphous silicon thin film, and is disposed between the first main surface and the first semiconductor layer;
a second semiconductor layer that includes an amorphous silicon thin film of a second conductivity type, and is disposed above the second main surface; and
a second intrinsic semiconductor layer that includes an intrinsic amorphous silicon thin film, and is disposed between the second main surface and the second semiconductor layer, wherein
a first oxygen concentration at an interface between the semiconductor substrate and the second intrinsic semiconductor layer is lower than a second oxygen concentration at an interface between the semiconductor substrate and the first intrinsic semiconductor layer, and
a third oxygen concentration at an interface between the second intrinsic semiconductor layer and the second semiconductor layer is higher than a fourth oxygen concentration at an interface between the first intrinsic semiconductor layer and the first semiconductor layer.

2. The solar cell according to claim 1, wherein
the first oxygen concentration is at least $1 \times 10^{20}$ cm$^{-3}$ and lower than $1 \times 10^{21}$ cm$^{-3}$,
the second oxygen concentration is at least $1 \times 10^{21}$ cm$^{-3}$ and lower than $1 \times 10^{22}$ cm$^{-3}$,
the third oxygen concentration is at least $1 \times 10^{21}$ cm$^{-3}$ and lower than $1 \times 10^{22}$ cm$^{-3}$, and
the fourth oxygen concentration is at least $1 \times 10^{20}$ cm$^{-3}$ and lower than $1 \times 10^{21}$ cm$^{-3}$.

3. The solar cell according to claim 1, wherein
an area of the second intrinsic semiconductor layer is larger than an area of the first intrinsic semiconductor layer in a plan view of the semiconductor substrate.

4. The solar cell according to claim 1, further comprising:
a diffusion inhibition layer that inhibits diffusion of a dopant of the second semiconductor layer at the interface between the second intrinsic semiconductor layer and the second semiconductor layer, wherein
the diffusion inhibition layer includes oxygen, carbon, and nitrogen.

5. The solar cell according to claim 1, wherein
a film thickness of the second intrinsic semiconductor layer is less uneven than a film thickness of the second semiconductor layer.

6. The solar cell according to claim 1, wherein
the first conductivity type is n-type conductivity, and
the second conductivity type is p-type conductivity.

* * * * *